(12) United States Patent
Tien et al.

(10) Patent No.: US 11,093,683 B2
(45) Date of Patent: Aug. 17, 2021

(54) TEST PATTERN GENERATION SYSTEMS AND METHODS

(71) Applicant: Taiwan Semiconductor Manufacturing Co., Ltd., Hsinchu (TW)

(72) Inventors: Fu-An Tien, Hsinchu (TW); Hsu-Ting Huang, Hsinchu (TW); Ru-Gun Liu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/559,097

(22) Filed: Sep. 3, 2019

(65) Prior Publication Data

US 2020/0134131 A1    Apr. 30, 2020

Related U.S. Application Data

(60) Provisional application No. 62/753,652, filed on Oct. 31, 2018.

(51) Int. Cl.
*G06F 30/398* (2020.01)
*G06F 30/394* (2020.01)

(52) U.S. Cl.
CPC .......... *G06F 30/398* (2020.01); *G06F 30/394* (2020.01)

(58) Field of Classification Search
CPC .... G01R 31/317; G06F 30/394; G06F 30/398
See application file for complete search history.

(56) References Cited

U.S. PATENT DOCUMENTS

2006/0215899 A1*  9/2006  Oaki .................. G06T 7/001
                                                  382/145

FOREIGN PATENT DOCUMENTS

| TW | 201723899 A | 7/2017 |
| TW | 201820188 A | 6/2018 |
| TW | 201633192 A | 9/2019 |

\* cited by examiner

*Primary Examiner* — Vuthe Siek
(74) *Attorney, Agent, or Firm* — Seed Intellectual Property Law Group LLP

(57) ABSTRACT

Systems and methods are provided for generating test patterns. In various embodiments, systems and methods are provided in which machine learning is utilized to generate the test patterns in a manner so that the test patterns conform with design rule check (DRC) specified for a particular semiconductor manufacturing process or for particular types of devices. A test pattern generation system includes test pattern generation circuitry which receives a noise image. The test pattern generation generates a pattern image based on the noise image, and further generates a test pattern based on the pattern image. The test pattern is representative of geometric shapes of an electronic device design layout that is free of design rule check violations.

20 Claims, 7 Drawing Sheets

TEST PATTERN GENERATION SYSTEMS AND METHODS

BACKGROUND

In an electronic circuit design process, one or more electronic design automation (EDA) tools may be utilized to design, optimize, and verify semiconductor device designs, such as circuit designs in a semiconductor chip. During placement, a placer tool may produce a placement layout based on a given circuit design, which may be developed by a circuit designer and which may include, for example, circuit design information such as electrical diagrams, high level electrical description of the circuit design, a synthesized circuit netlist, or the like. The placement layout includes information indicating physical positions of various circuit elements of the semiconductor device. After the placement of the device is completed, clock-tree synthesis and routing may be performed. During routing, wires or interconnections may be formed to connect the various circuit elements of the placement layout.

The layout for the electronic device (e.g., after placement or routing) may be may be checked for compliance with various design rules, design specifications, or the like. For example, the electronic device design may be checked for various design rule check (DRC) violations. DRC checking is used to determine whether the physical layout of the electronic device design satisfies a set of design rules. The design rules may be specific to a particular semiconductor process, and in some cases they may be specific to a particular type of circuit that is being designed. The design rules may provide certain geometric restrictions regarding the size and placement of the various circuit elements of the layout, which may be represented by cells having particular geometric shapes which correspond to various features of semiconductor devices, including, for example, diffusion layers, polysilicon layers, metal layers, and/or interconnections between layers. For example, the design rules may specify particular minimum or maximum dimensions (e.g., minimum width, minimum area, etc.) for the cells of the layout. Additionally, the design rules may specify particular spacing (e.g., a minimum spacing) that must be present between cells of the layout.

DRC checking may be performed by a DRC tool, which typically receives as input a layout (e.g., electronic layout files which represent the layout of the electronic device design to be checked) which may be in any format, such as in the GDSII standard format (referred to herein as "GDS"). The DRC tool also receives as input a list of the design rules which may be specific to the semiconductor process chosen for fabrication. Based on these inputs, the DRC tool produces a report of design rule violations or DRC violations which can be used to modify the electronic device design in order to fix the DRC violations.

The list or set of design rules for a particular process, as implemented by the DRC tool, may be referred to as a rule deck or a DRC deck. When developing the DRC deck for a process, a set of layout test cases or test patterns may be used to verify functionality and accuracy of the DRC deck. For example, the test patterns may be used to verify that the design rules, when implemented by the DRC tool to check an electronic device design, accurately identify DRC violations. The DRC deck for implementation by the DRC tool and the test patterns are typically manually created.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
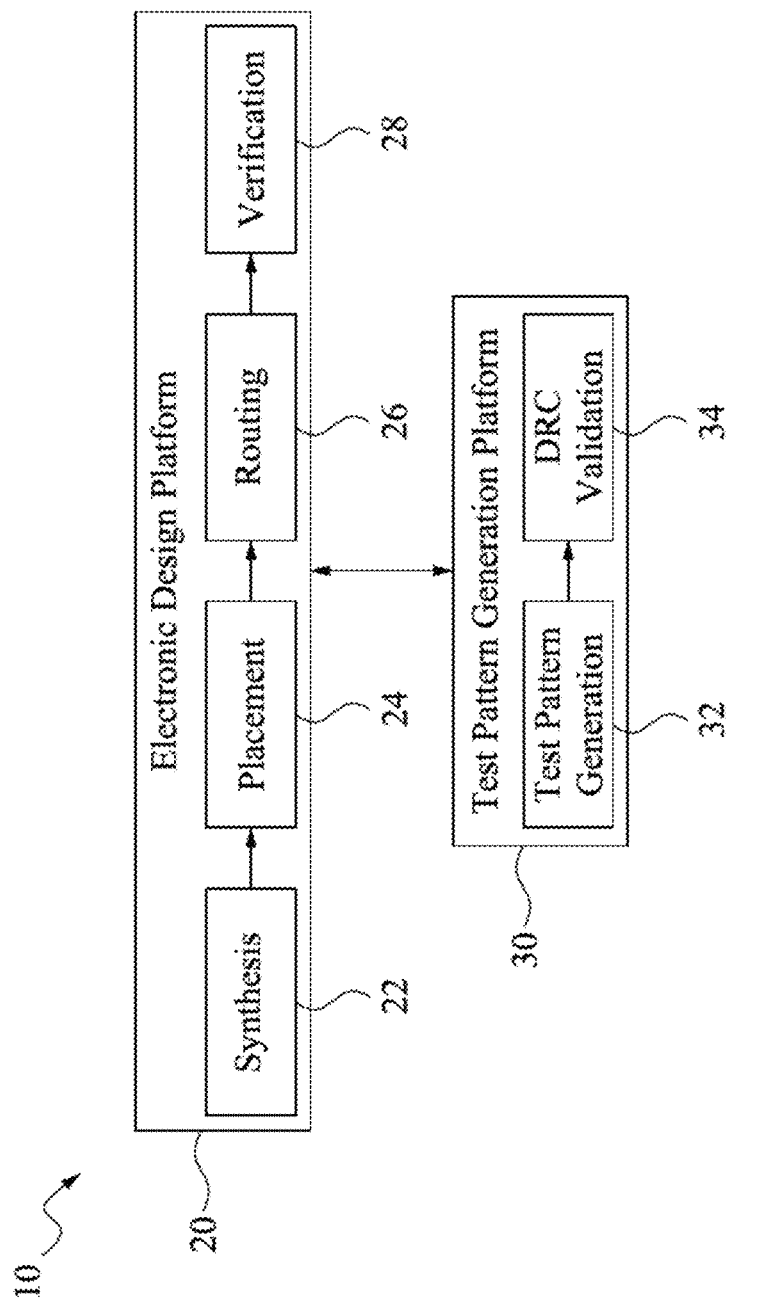
FIG. 1 is a block diagram illustrating an electronic device design system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments provided herein include systems and methods for generating test patterns which may be used for early assessments of lithographic or other semiconductor manufacturing processes, including, for example, for testing design rule check (DRC) features of an electronic device platform. In some embodiments, machine learning techniques are utilized to generate the test patterns, and the machine learning techniques may be used to generate the test patterns so that they conform to DRC rules which may be proscribed for particular semiconductor manufacturing processes or for particular electronic device types.

FIG. 1 is a block diagram illustrating an electronic device design system 10, in accordance with one or more embodiments of the present disclosure. The electronic device design system 10 is operable to generate test patterns (which may be referred to herein as test layouts or test layout clips) for early assessments of lithographic or other semiconductor manufacturing processes.

The electronic device design system 10 includes an electronic design platform 20 and a test pattern generation platform 30. In some embodiments, the electronic design platform 20 or the test pattern generation platform 30 may be implemented in hardware, firmware, software, or any combination thereof. For example, in some embodiments, the electronic design platform 20 or the test pattern generation platform 30 may be at least partially implemented as instructions stored on a computer-readable storage medium, which may be read and executed by one or more computer processors or processing circuitry. The computer-readable storage medium may be, for example, read-only memory (ROM), random access memory (RAM), flash memory, hard disk drive, optical storage device, magnetic storage device, electrically erasable programmable read-only memory (EE-PROM), organic storage media, or the like.

The electronic design platform 20 may include a plurality of electronic device design tools that may be implemented at least in part as software tools which, when executed by one or more computing devices, processors, or the like, can be utilized to design and generate one or more electronic device layouts, including placement layouts and associated routing for electronic devices circuits, which may include, for example, one or more integrated circuits (ICs).

In some embodiments, the electronic design platform 20 and the test pattern generation platform 30 may be included in or otherwise implemented by a same apparatus, such as a same computing system or device. In other embodiments, the electronic design platform 20 and the test pattern generation platform 30 may be included in or otherwise implemented by separate apparatuses, such as separate and remotely located computing systems or devices.

The electronic design platform 20 includes electronic device design tools which can be used, for example, to design high-level programming descriptions of analog and/or digital circuitry for an electronic device. In some embodiments, the high-level programming descriptions can be implemented using a high-level programming language, such as C, C++, LabVIEW, MATLAB, a general purpose system design or modeling language, such as SysML, SMDL and/or SSDL, or any other suitable high-level programming language. In some embodiments, the electronic design platform 20 may include various additional features and functionalities, including, for example, one or more tools suitable to simulate, analyze, and/or verify the high-level programming descriptions of circuitry for the electronic device.

In some embodiments, the electronic design platform 20 includes a synthesis tool 22, a placement tool 24, a routing tool 26, and a verification tool 28, each of which may be implemented at least in part as software tools accessible to and executable by one or more computing devices, processors or the like.

The synthesis tool 22 translates one or more characteristics, parameters, or attributes of the electronic device into one or more logic operations, one or more arithmetic operations, one or more control operations, or the like, which may then be translated into the high-level programming descriptions in terms of the analog circuitry and/or the digital circuitry.

The placement tool 24 generates cells which correspond to, or otherwise implement, the one or more logic operations, one or more arithmetic operations, one or more control operations, or the like produced by the synthesis tool 22. The cells may include geometric shapes which correspond to various features of semiconductor devices, including, for example, diffusion layers, polysilicon layers, metal layers, and/or interconnections between layers.

In some embodiments, the geometric shapes for some of the analog circuitry or the digital circuitry can be defined in accordance with a standard cell from among a predefined library of standard cells associated with a technology library. The standard cell represents one or more semiconductor devices as well as their interconnection structures that are configured and arranged to provide a logical function, such as AND, OR, XOR, XNOR, or NOT, or a storage function, such as a flipflop or a latch. The predefined library of standard cells may be defined in terms of geometric shapes which correspond to diffusion layers, polysilicon layers, metal layers, and/or interconnections between layers. Thereafter, the placement tool 24 assigns locations for the geometric shapes on a printed circuit board (PCB) and/or a semiconductor substrate.

The electronic design platform 20 may perform clock tree synthesis (CTS) on a design generated, for example, by the placement tool 24. In some embodiments, the placement tool 24 may perform the clock tree synthesis. In other embodiments, a CTS tool may be included in the electronic design platform 20 to perform CTS on designs received from the placement tool 24. Clock tree synthesis generally refers to a process of synthesizing a clock tree to achieve zero or minimal skew and insertion delay, and may include inserting one or more buffers or inverters along clock paths of the electronic device design.

The routing tool 26 produces physical interconnections between the cells or the geometric shapes in the layout provided by the placement tool 24. In some embodiments, the routing tool 26 utilizes a textual or an image-based netlist describing the analog circuitry, the digital circuitry, the technology library, a semiconductor foundry for fabricating the electronic device or a semiconductor technology node for fabricating the electronic device to assign the interconnections between the geometric shapes.

The verification tool 28 may perform various verifications or checks on an electronic device layout, e.g., after placement and routing. The verification tool 28 verifies that the electronic device design, including the layout of the cells or geometric shapes provided by the placement tool 24, as well as the interconnections between the cells or geometric shapes provided by the routing tool 26, satisfies one or more specifications, rules, or the like associated with the electronic device design. The verification tool 28 may perform a physical verification, in which the verification tool 28 verifies whether an electronic device design is physically manufacturable, and that the resulting chips will meet the design specifications and will not have physical defects which prevent the chips from functioning as designed.

In some embodiments, the verification tool 28 may perform a design rule check (DRC) to determine whether the electronic device design, including the geometric shapes, the locations of the geometric shapes, or the interconnections between the geometric shapes assigned by the placement tool 24 or the routing tool 26, satisfies the design rules, as may be defined by a semiconductor foundry or semiconductor technology node for fabricating the electronic device. The verification tool 28 may determine the presence of one or more DRC violations in the electronic device design, and in some embodiments, the verification tool 28 may generate information indicating locations of the one or more DRC violations in the electronic device design.

In some embodiments, the test pattern generation platform 30 is configured to generate test patterns which may be used to validate the design rules (e.g., the DRC deck) that are implemented by the verification tool 28. For example, the test pattern generation platform 30 may generate test patterns which are expected to have a known outcome as a result of DRC checking. For examples, the generated test patterns may be known or expected to conform to the design rules which should be implemented by the DRC deck. The test patterns may thus be utilized as test cases for DRC checking features of the verification tool 28, to confirm that the DRC checking features are properly functioning (e.g., that the design rules have been properly coded or programmed into the DRC checking features), or in some cases, to confirm whether the design rules should be modified.

As will be discussed in further detail herein, the test pattern generation platform 30 may generate test patterns by implementing one or more machine learning approaches, for example, in which past data is utilized to train a machine learning model to generate test patterns representative of portions of layouts (which may be referred to herein as layout clips) that are known or expected to conform to DRC rules. The past data utilized for training the machine learning model may include, for example, layout clips for electronic device designs which are known to be free of DRC violations, as well as layout clips for electronic device designs which are known to include one or more DRC violations. In some embodiments, the past data may be layout clips from electronic device designs that have been verified, for example, by the verification tool 28, which may indicate the presence of DRC violations in the electronic device, as well as locations of such DRC violations.

The test pattern generation platform 30 may include various tools which may be implemented at least in part as software tools which, when executed by one or more computing devices, processors, or the like, can be utilized to generate test patterns for testing various different categories of electronic device types and for assessment of various different lithographic or other semiconductor manufacturing processes utilized in the manufacturing of electronic devices, including, for example, for testing the DRC checking features of the electronic device platform 20.

In some embodiments, the test pattern generation platform 30 includes a test pattern generation tool 32, and a DRC validation tool 34, each of which may be implemented at least in part as software tools accessible to and executable by one or more computing devices, processors or the like. In some embodiments, the test pattern generation tool 32 or the DRC validation tool 34 may be implemented as circuitry operable to perform any of the functions described herein with respect to the test pattern generation tool 32 or the DRC validation tool 34. In some embodiments, the electronic design platform 20 and the test pattern generation platform 30 may be integrated, and may be implemented in a same platform. For example, each of the various tools described herein with respect to the electronic design platform 20 and the test pattern generation platform 30 may be accessed or otherwise implemented, at least in part, by a same apparatus, such as a computer device.

In some embodiments, the test pattern generation platform 30 receives training input from the electronic design platform 20. For example, the test pattern generation platform 30 may receive training input in the form of layout clips from the electronic design platform 20 after DRC checking has been performed, for example, by the verification tool 28. The test pattern generation platform 30 may implement a machine-learning approach to learn to generate test patterns which conform to design rules for any particular electronic device design, device category, or lithographic or other semiconductor manufacturing process, based on the training of the test pattern generation platform 30. For example, the test pattern generation tool 32 may receive the training data in the form of layout clips from the electronic design platform 20, and the test pattern generation tool 32 may implement a machine-learning approach to generate, based on another input (which may be a random noise vector, in some embodiments), test patterns that represent layout clips that conform to the design rules. This may be performed without actually providing any design rules to the test pattern generation tool 32. Rather, the test pattern generation tool 32 may learn to generate test patterns which conform to the design rules based only on the training of the test pattern generation tool 32.

As will be described in further detail below, in some embodiments, the test pattern generation tool 32 may include machine learning circuitry 140 which may be trained to generate the test patterns based on input training data 150 (e.g., labeled layout clips which have been previously checked by a DRC checking tool and which are known to be free of DRC violations or to include one or more DRC violations). The DRC validation tool 34 may be communicatively coupled to a DRC checking tool, such as a DRC checking tool within the verification tool 28, and may be utilized to test the test patterns generated by the test pattern generation tool 32 in order to confirm that the DRC checking tool is properly functioning to implement the actual specified design rules, or to confirm whether the design rules should be modified.

Figure 2:
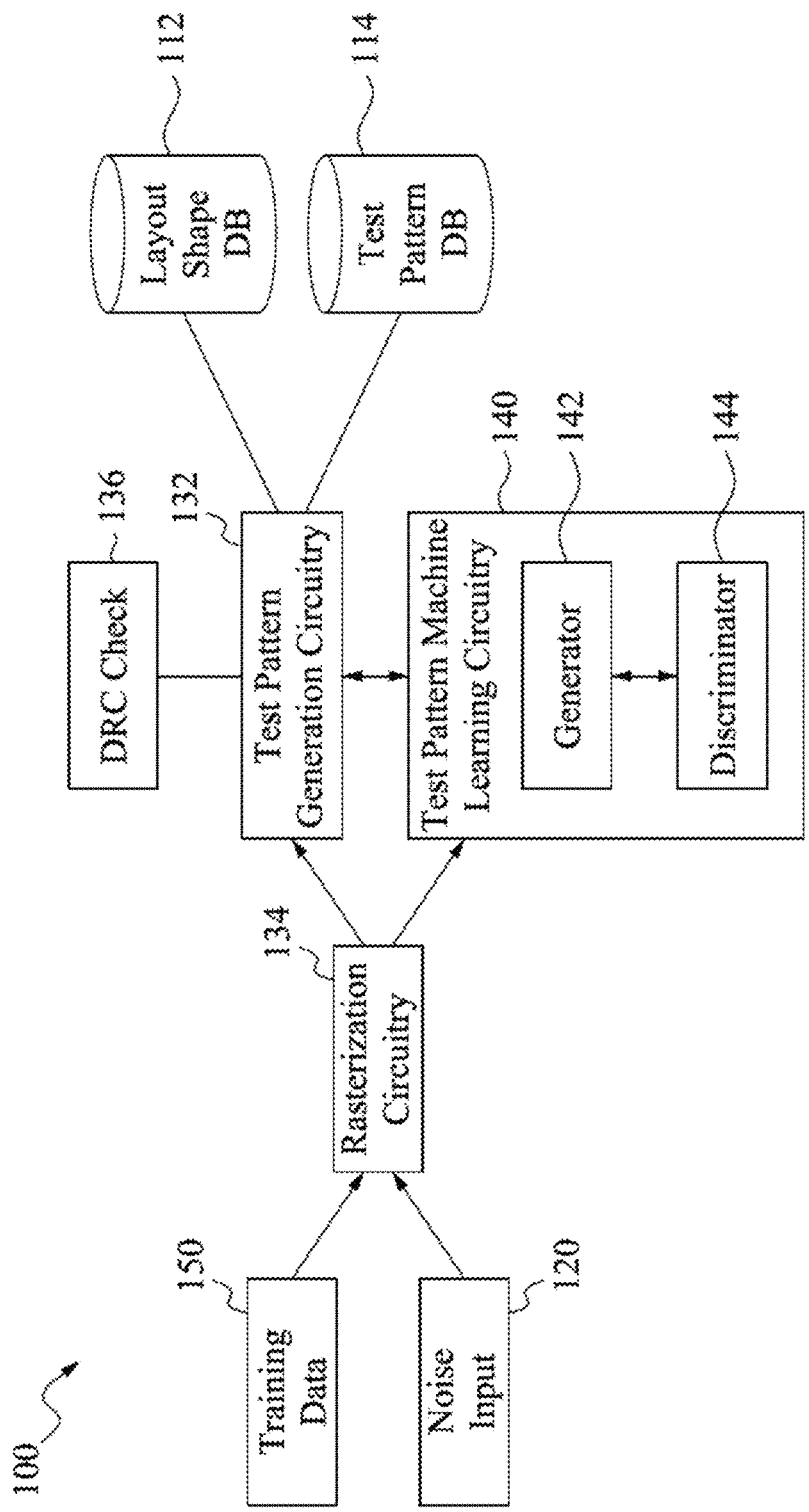
FIG. 2 is a block diagram illustrating a test pattern generation system, in accordance with some embodiments.

FIG. 2 is a block diagram illustrating a test pattern generation system 100, in accordance with embodiments of the present disclosure. The test pattern generation system 100 may be used in conjunction with, and may include one or more of the features and functionality of, the test pattern generation platform 30 shown in FIG. 1. In some embodiments, the test pattern generation system 100 is included in or implemented by the test pattern generation platform 30. For example, in some embodiments, the test pattern generation system 100 may be implemented or otherwise accessed by the test pattern generation tool 32 to generate test patterns which may be used to confirm design rules implemented by the verification tool 28 of the electronic design platform 20.

As shown in FIG. 2, the test pattern generation system 100 includes test pattern generation circuitry 132. The test pattern generation circuitry 132 may include, or otherwise be executed by, a computer processor configured to perform the various functions and operations described herein. For example, the test pattern generation circuitry 132 may be executed by a computer processor selectively activated or reconfigured by a stored computer program, or may be a specially constructed computing platform for carrying out the features and operations described herein.

In some embodiments, the test pattern generation circuitry 132 includes memory which stores instructions for performing one or more of the features or operations described herein, and the test pattern generation circuitry 132 may be operable to execute instructions stored, for example, in the memory to perform the functions of the test pattern generation circuitry 132 described herein. The memory may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The test pattern generation circuitry 132 may be communicatively coupled to rasterization circuitry 134, and the rasterization circuitry 134 may receive a noise input 120. In some embodiments, the noise input 120 is a random noise vector which may be generated by any suitable random noise generator, such as any known noise generator or random number generator which is operable to generate a vector of random values, which may be described in a vector or a vector graphics format. In some embodiments, the noise input 120 may be provided from a noise input database, which may store a plurality of random noise vectors which may be sequentially or randomly accessed for generation of test patterns, for example, by the test pattern generation circuitry 132.

The rasterization circuitry 134 generates a raster image of the noise input (which may be referred to herein as a noise image) by rasterizing the noise input 120, and the noise image is provided to the test pattern generation circuitry 132. Rasterization generally refers to a task of converting an image described in a vector graphics format (e.g., the noise input 120, which may be representative of shapes of a random image) and converting it into a raster image, which may be a series of pixels, dots or lines, which, when displayed together, create the image that was represented via shapes. The rasterized image (e.g., the noise image) may then be processed by the test pattern generation circuitry 132 and used to generate test patterns.

The test pattern generation circuitry 132 analyzes the received noise image, and generates a test pattern based on the analyzed noise image. For example, the test pattern generation circuitry 132 may generate the test pattern by accessing a machine learning model (which may be one or more neural networks stored or implemented, for example, by the test pattern machine learning circuitry 140) that is trained with past data in the form of layout clips for electronic device designs which are known to be free of DRC violations, as well as layout clips for electronic device designs which are known to include one or more DRC violations.

In some embodiments, the test pattern generation circuitry 132 may generate the test patterns by employing one or more artificial intelligence or machine learning techniques, which in some embodiments may be implemented at least in part by the test pattern machine learning circuitry 140. Some or all of the functionalities described herein with respect to the test pattern generation circuitry 132 may be performed automatically by the test pattern generation circuitry 132, for example, in response to receiving a noise image from the rasterization circuitry 134. In some embodiments, the test pattern machine learning circuitry 140 may be included as a part of the test pattern generation circuitry 132.

"Artificial intelligence" is used herein to broadly describe any computationally intelligent systems and methods that can learn knowledge (e.g., based on training data), and use such learned knowledge to adapt its approaches for solving one or more problems. For example, the test pattern machine learning circuitry 140 may employ artificial intelligence techniques to generate test patterns based on a received input, such as rasterized noise images. Machine learning generally refers to a sub-field or category of artificial intelligence, and is used herein to broadly describe any algorithms, mathematical models, statistical models, or the like that are implemented in one or more computer systems or circuitry, such as processing circuitry, and which build one or more models based on sample data (or training data) in order to make predictions or decisions.

The test pattern generation circuitry 132 or the test pattern machine learning circuitry 140 may employ, for example, neural network, deep learning, convolutional neural network, Bayesian program learning, support vector machines, and pattern recognition techniques to solve problems such as generating test patterns that are known or expected to conform to specified design rules. Further, the test pattern generation circuitry 132 or the test pattern machine learning circuitry 140 may implement any one or combination of the following computational algorithms and/or techniques: classification, regression, supervised learning, unsupervised learning, feature learning, clustering, decision trees, or the like.

In some embodiments, one or more convolutional neural networks may be utilized by the test pattern generation circuitry 132 or the test pattern machine learning circuitry 140 to develop, train, or update a model which may be utilized to generate the test patterns. Convolutional neural networks are a class of deep neural networks which may be applied to analyzing visual imagery. In accordance with various embodiments of the present disclosure, the test pattern machine learning circuitry 140 may include one or more convolutional neural networks to analyze visual imagery in the form of noise images, and to generate the test patterns based on the received noise images.

An example neural network, in accordance with one or more embodiments, may include a plurality of interconnected "neurons" which exchange information between each other. The connections have numeric weights that can be tuned based on experience, and thus neural networks are adaptive to inputs and are capable of learning. The "neurons" may be included in a plurality of separate layers which are connected to one another, such as an input layer, a hidden layer, and an output layer. The neural network may be trained by providing training data 150 (e.g., layout clips for electronic device designs which are known to be free of DRC violations, and layout clips for electronic device designs which are known to include one or more DRC violations) to the input layer. Through training, the neural network may generate or modify the hidden layer, which represents weighted connections mapping the training data provided at the input layer to known output information at the output layer (e.g., classification of an input layout as being free of DRC violations ("valid") or as having one or more DRC violations ("invalid")). Relationships between neurons of the input layer, hidden layer, and output layer, formed through the training process and which may include weight connection relationships, may be stored, for example, as a machine learning model within or otherwise accessible to the test pattern machine learning circuitry 140.

The test pattern machine learning circuitry 140 may include a generator 142 and a discriminator 144, each of which may include one or more neural networks, such as convolutional neural networks. The generator 142 and the discriminator 144 may be co-optimized through a training process, and the discriminator 144 may be used to train the generator 142 to generate valid (e.g., DRC violation free) test patterns. Training of the test pattern machine learning circuitry 140 will be described in further detail with respect to FIGS. 3 through 6. In some embodiments, the generator 142 and the discriminator 144 may be or otherwise form a generative adversarial network (GAN). For example, the generator adversarial network may utilize two neural networks (e.g., the generator 142 neural network and the discriminator 144 neural network), and the generative network (e.g., the generator 142) may generate candidates (e.g., candidate test patterns) while the discriminative network (e.g., the discriminator 144) evaluates them, for example, by labeling the test patterns as false (e.g., invalid) or true (e.g., valid). Through this process, test patterns may be developed which are DRC error free, and further which are more practical than test patterns developed through conventional techniques.

Once the neural networks of the test pattern machine learning circuitry 140 (e.g., neural networks of the generator 142 and the discriminator 144) have been sufficiently trained, the neural network of the generator 142 may be provided with non-training data (e.g., the noise input 120 after rasterization by the rasterization circuitry 134) at the input layer. Utilizing test pattern generation knowledge (e.g., which may be stored in the machine learning model, and which may include, for example, weighted connection information between neurons of the neural network), the neural network may generate pattern images at the output layer.

The pattern images may be generated by the test pattern generation circuitry 132, for example, by accessing one or more neural networks of the test pattern machine learning circuitry 140 to generate the pattern images based on the rasterized noise input 120. The test pattern generation circuitry 132 may convert the pattern images into corresponding layout clips. The layout clips may be generated based on the pattern images, for example, by accessing a layout shape database 112 which may store a plurality of shapes, which in some embodiments may represent cells having particular geometric shapes which correspond to various features of semiconductor devices, including, for example, diffusion layers, polysilicon layers, metal layers, or interconnections between layers. In some embodiments, the layout shape database 112 may include GDS files, which may be electronic files which represent geometrical shapes of a layout, or of layout components, for example, in the GDSII database file format.

By converting the generated pattern images into corresponding layout clips, the layout clips may be analyzed by DRC check circuitry 136. For example, the DRC check circuitry 136, in some cases, may not be able to check for DRC violations in an image, such as the generated pattern images, since the DRC check circuitry 136 may be configured to operate based on a particular format representative of layout clips, such as layout clips in the GDS format. On the other hand, the DRC check circuitry 136 may be operable to check for DRC violations in any layout clip, including layout clips generated by the electronic design platform 20 as previously described with respect to FIG. 1, as well as layout clips (e.g., test layouts or test patterns) that are generated by the test pattern generation circuitry 132 based on the generated pattern images. The DRC check circuitry 136 may be substantially the same as the DRC checking tool of the verification tool 28 as previously described. In some embodiments, the DRC check circuitry 136 may be the same as the DRC checking tool of the verification tool 28 of the electronic design platform 20 described with respect to FIG. 1.

If a generated layout clip is determined to be free of DRC violations, for example, by the DRC check circuitry 136, then the layout clip may be considered as a valid test pattern (e.g., a generated test layout that is free of DRC violations), and the test pattern may be stored in the test pattern database 114.

In some cases, the DRC check circuitry 136 may identify one or more DRC violations in the generated layout clips, and in some embodiments, the DRC check circuitry 136 or the test pattern generation circuitry 132 may be configured to fix such identified DRC violations in the generated layout clips. For example, the DRC check circuitry 136 or the test pattern generation circuitry 132 may be configured to apply one or more design rules to adjust the arrangement of geometric shapes in the generated layout clip. For example, the DRC check circuitry 136 or the test pattern generation circuitry 132 may be configured to adjust a spacing between one or more of the geometric shapes, to reduce or increase a width of one or more of the geometric shapes, or the like, so that the arrangement of the geometric shapes of the generated layout clip is made to conform to the specified design rules. The modified layout clip may be rechecked by the DRC check circuitry 136 to confirm that it is free of DRC violations, in which case, the modified layout clip may be stored as a valid test pattern in the test pattern database 114.

In some embodiments, a generated layout clip may be discarded by the test pattern generation system 100 in response to the DRC check circuitry 136 determining that the layout clip has one or more DRC violations.

The test patterns stored in the test pattern database 114 may be utilized for assessment of lithographic or other semiconductor manufacturing processes. For example, the DRC validation tool 34 of the test pattern generation platform 30 may access the test patterns stored in the test pattern database 114, which may test the test patterns to confirm that the DRC checking tool is properly functioning to implement the actual specified design rules, or to confirm whether the design rules should be modified. In this way, the test patterns may be used to test various different categories of electronic device types and for assessment of various different lithographic or other semiconductor manufacturing processes utilized in the manufacturing of electronic devices, including, for example, for testing the DRC checking features of the electronic device platform 20.

Figure 3:
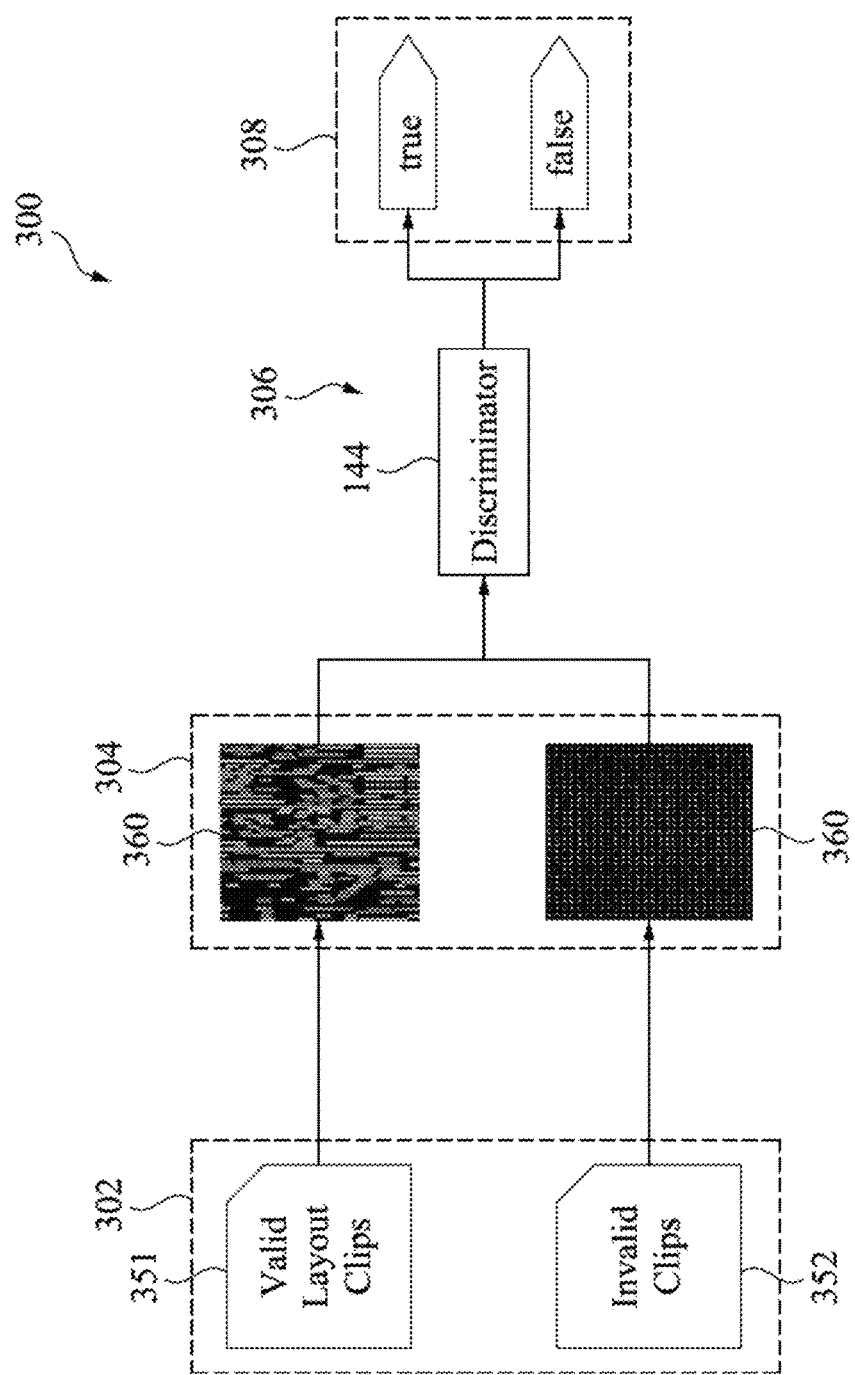
FIG. 3 is a flow chart illustrating a method of pre-training a discriminator of test pattern machine learning circuitry, in accordance with some embodiments.

FIG. 3 is a flow chart 300 illustrating a method of training the discriminator 144 of the test pattern machine learning circuitry 140, in accordance with one or more embodiments. The training illustrated in FIG. 3 may be referred to as pre-training of the discriminator 144, as this training may be utilized as an initial training process for the discriminator 144, and the discriminator 144 may be further trained based on a co-optimization training of the discriminator 144 and the generator 142, as will be discussed in further detail with respect to FIGS. 5 and 6.

As previously described with respect to FIG. 2, in some embodiments, the discriminator 144 may be or include a convolutional neural network. The convolutional neural network may be used for pattern classification. For example, the discriminator 144 may be operable to perform image classification algorithms, including any such image classification algorithms which may be well-known in the relevant art. The discriminator 144 may be trained to classify received patterns (or images) as representative of valid data or invalid data.

At 302, a plurality of layout clips is provided for training the discriminator 144. The layout clips may be provided as training data 150, as previously described with respect to FIG. 2. For example, the layout clips at 302 may include valid layout clips 351 for electronic device designs which are known to be free of DRC violations, as well as invalid layout clips 352 for electronic device designs which are known to include one or more DRC violations. The invalid layout clips 352 may be layout clips including hotspots or other circuit defects which may be identified as DRC violations. The layout clips 351, 352 may be pre-classified and labeled layout clips for training of the discriminator 144. For example, the valid layout clips 351 may be labeled as "valid" and the invalid layout clips 352 may be labeled as "invalid" so that the discriminator 144 may learn to classify received input as valid or invalid based on the training.

At 304, the valid and invalid layout clips 351, 352 are rasterized to generate rasterized images 360. The rasterized images 360 may be generated, for example, by the rasterization circuitry 134 previously described herein. For example, the rasterization circuitry 134 may receive the layout clips 351, 352 as image data described in a vector graphics format (which may be provided, for example, as GDS files or the like), and may convert them into raster images, or a series of pixels, dots or lines, which, when displayed together, create the image which was represented via the shapes.

At 306, the rasterized images 360 are input to the discriminator 144 for training the discriminator 144. In some embodiments, the discriminator 144 includes a plurality of neural networks, such as convolutional neural networks, each of which may be trained based on invalid layout clips (e.g., valid and invalid clips 351, 352) representative of layouts of a particular category of device types, such as central processing units (CPUs), graphics processing units (GPUs), field programmable gate arrays (FPGAs), application-specific integrated circuits (ASICs), systems on a chip (SOCs), memory devices, artificial intelligence (AI) chips, or any other category of electronic device types.

Through training of the discriminator 144, the discriminator 144 may modify parameters of the neural network, such as modifying weights and biases that may be applied in a hidden layer and which map the training data provided at the input layer to known output information at the output layer (e.g., classification of an input layout as being free of DRC violations ("valid") or as having one or more DRC violations ("invalid")).

At 308, the discriminator 144 outputs classifications for each of the input training data, e.g., for the received rasterized images 360. The classifications output by the discriminator 144 may be either a true (or "valid") classification for a received training input, or a false (or "invalid") classification for a received training input. Because the input training data is labeled data which pre-classifies whether the input data represents a valid layout clip 351 or an invalid layout clip 352, the output classification generated by the discriminator 144 should match the input labels of the training data, and the discriminator 144 may learn to update or modify the weights and biases of its neural networks in order to output the correct classification as a result of processing of the received rasterized images 360.

Once the discriminator 144 has been trained, it effectively serves to identify whether a pattern image (e.g., as trained by the rasterized images 360) represents a valid layout clip (e.g., a layout clip that is free of DRC violations) or an invalid layout clip (e.g., a layout clip that includes DRC violations).

Figure 4:
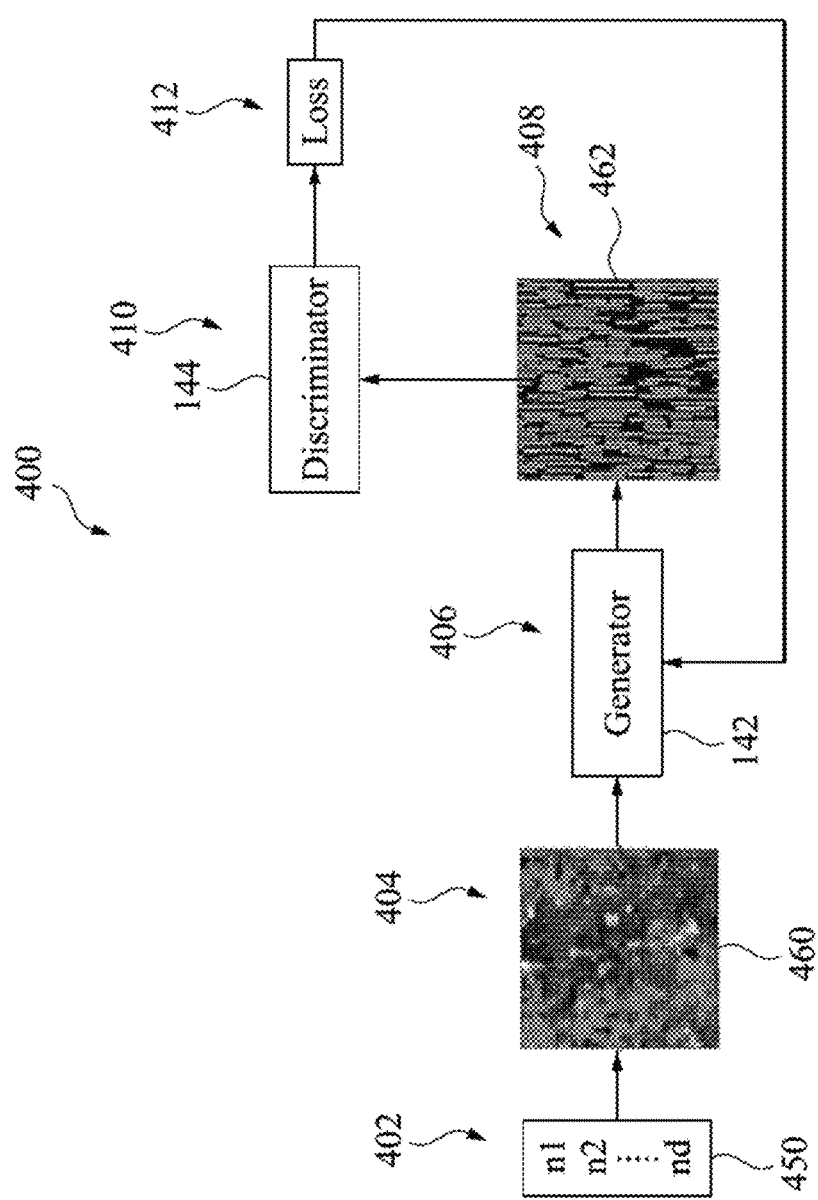
FIG. 4 is a flow chart illustrating a method of pre-training a generator of the test pattern machine learning circuitry, in accordance with some embodiments.

FIG. 4 is a flow chart 400 illustrating a method of training the generator 142 of the test pattern machine learning circuitry 140, in accordance with one or more embodiments. The training illustrated in FIG. 4 may be referred to as pre-training of the generator 142, as this training may be utilized as an initial training process for the generator 142, and the generator 142 may be further trained based on a co-optimization training of the generator 142 and the discriminator 144, as will be discussed in further detail with respect to FIGS. 5 and 6.

As previously described with respect to FIG. 2, in some embodiments, the generator 142 may be or include a neural network. In some embodiments, the generator 142 may be or include a neural network having one or more deconvolution layers or transposed convolution layers. The generator 142 may be trained to generate images (such as pattern images as previously described with respect to FIG. 2) based on received noise input.

At 402, a plurality of noise vectors 450 is provided for training the generator 142. The noise vectors 450 may be provided as a form of the training data 150, as previously described with respect to FIG. 2. In some embodiments, the noise vectors 450 are substantially the same as the noise input 120 previously described with respect to FIG. 2, except that the noise vectors 450 are used for training the generator 142, while the noise input 120 is described with respect to FIG. 2 for generating pattern images which may be converted into test patterns. The noise vectors 450 may be any random noise vectors which may be generated by any suitable random noise generator, such as any known noise generator or random number generator which is operable to generate a vector of random values, which may be described in a vector or a vector graphics format.

At 404, the noise vectors 450 are converted to noise images 460 which are used for training the generator 142. The noise images 460 may be generated, for example, by the rasterization circuitry 134.

At 406, the noise images 460 are input to the generator 142 for training. At 408, the generator 142 outputs a generated image 462 which is generated by the generator 142 based on a received noise image 460. In some embodiments, the generator 142 generates the image 462 by processing the received noise image 460 through a plurality of layers of a convolutional neural network, or the like, which may apply a plurality of weights and biases to the received noise image 460 and which may output a resulting generated image 462.

The generated image 462 is provided to the discriminator 144 at 410, and the discriminator 144 (which may be pre-trained, as described with respect to FIG. 3) may output a classification for the generated image 462, e.g., as being representative of valid or invalid layout clip. Additionally, the discriminator 144 may output loss information at 412. The loss information may be provided, for example, by one or more loss layers which may be layers of the convolutional neural network of the discriminator. The loss information may indicate a proximity or closeness of the generated image 462 to being classified as "valid," which may be referred to as the loss (e.g., a deviation between a classification of the generated image 462 and a classification of a valid layout clip). That is, the loss information output by the discriminator 144 at 412 may indicate how close the generated image 462 is to representing a valid layout clip that would pass the discriminator check.

The output loss information is provided as feedback to the generator 142, which pre-trains the generator 142 based on the loss of previously generated images 462. For example, the generator 142 may modify parameters of its neural networks, such as modifying weights and biases that may be applied in a hidden layer based on the received loss information. For example, the generator 142 may adjust weights and biases in order to generate images 362 which minimize the losses, or which pass the discriminator check performed by the discriminator 144. This process may be iteratively repeated until the generator 142 consistently outputs generated images 462 which are deemed to be valid by the discriminator 144.

Figure 5:
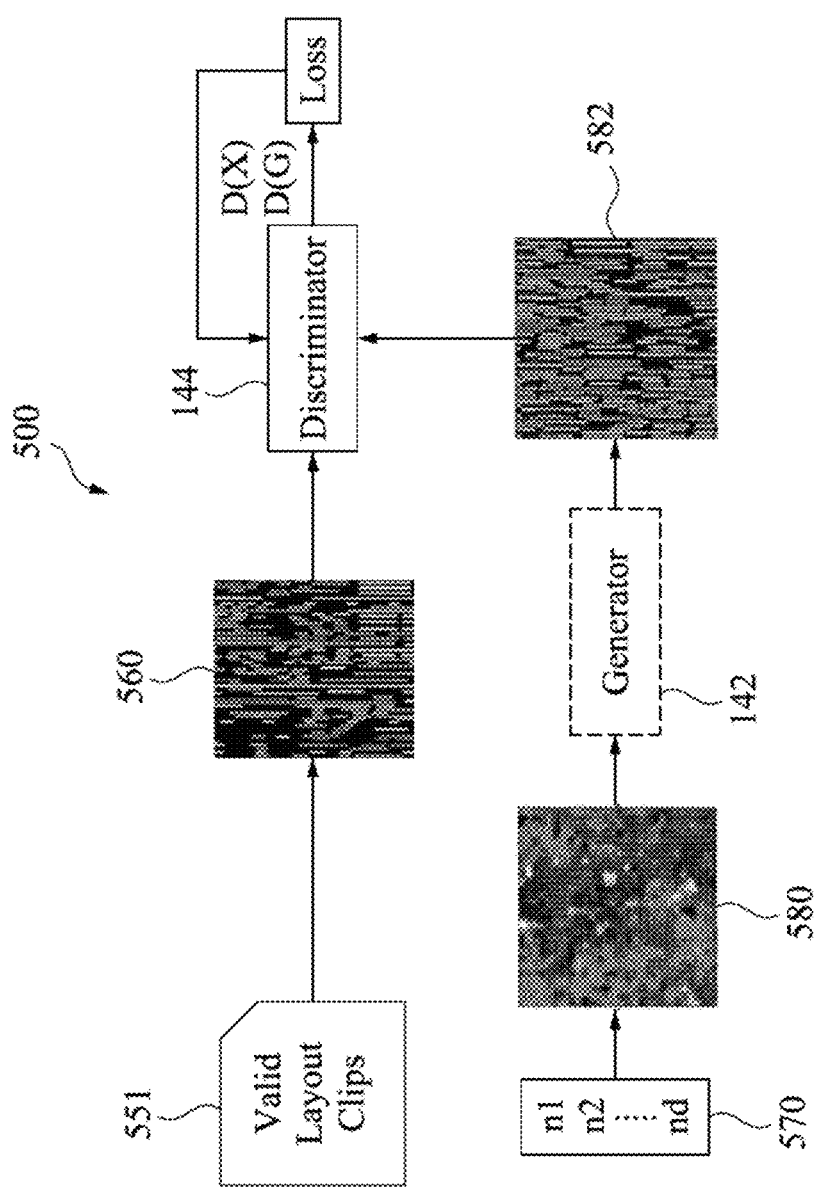
FIG. 5 is a flow chart illustrating a method of training the discriminator of the test pattern machine learning circuitry, in accordance with some embodiments.
Figure 6:
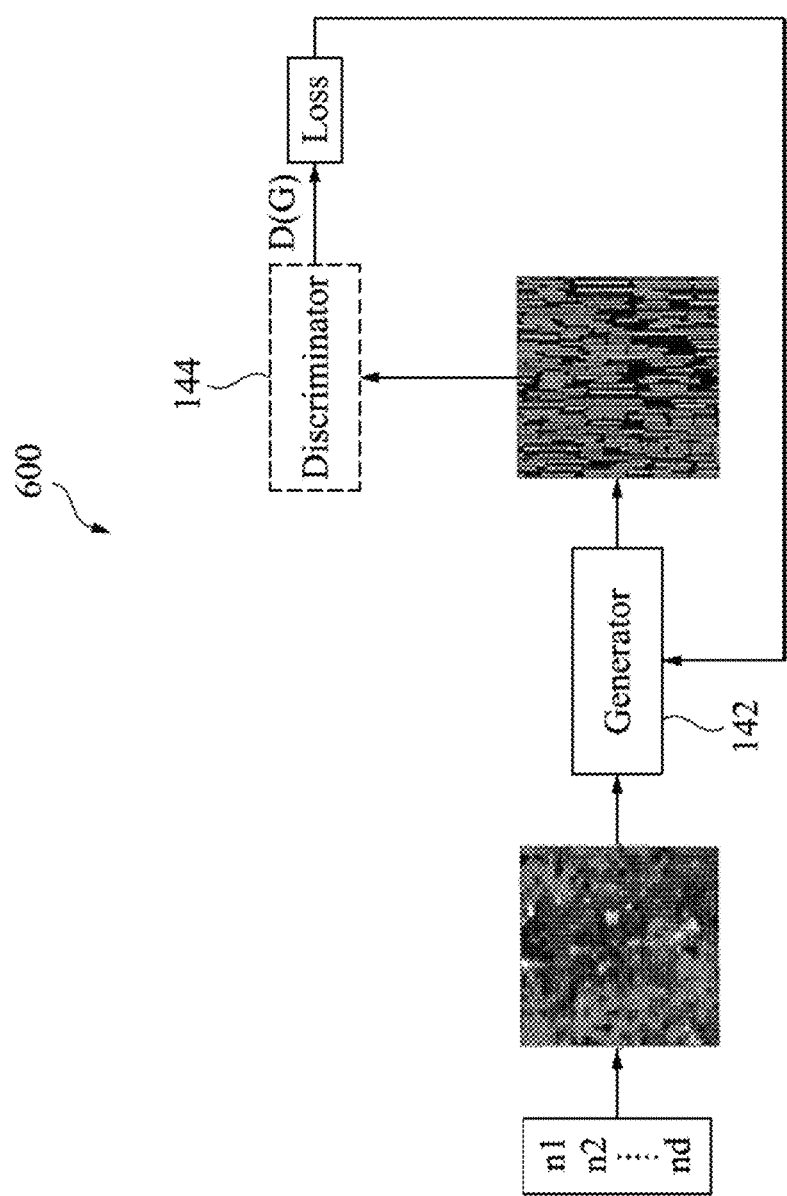
FIG. 6 is a flow chart illustrating a method of training the generator of the test pattern machine learning circuitry, in accordance with some embodiments.

FIG. 5 is a flow chart 500 illustrating a method of training the discriminator 144 of the test pattern machine learning circuitry 140, in accordance with one or more embodiments. FIG. 6 is a flow chart 600 illustrating a method of training the generator 142 of the test pattern machine learning circuitry 140. The methods illustrated in FIGS. 5 and 6 may be iteratively and alternately performed to co-optimize the training of the discriminator 144 and the generator 142.

Referring now to FIG. 5, the discriminator 144 is trained based on rasterized images 560 that are generated based on valid layout clips 551, and the discriminator 144 is also trained based on generated images 462 that are generated by the generator 142. During training of the discriminator 144, as shown in FIG. 5, the weights and biases of the neural networks of the generator 142 are fixed, while the weights and biases of the neural networks of the discriminator 144 may be updated or modified based on the training illustrated in FIG. 5.

The valid layout clips 551 shown in FIG. 5 may be substantially the same as the valid layout clips 351 shown and described with respect to FIG. 3. For example, the valid layout clips 551 may be layout clips representative of layouts which are known to be free of DRC violations. In some embodiments, the valid layout clips 551 may be pre-classified and labeled (e.g., as "valid") so that the discriminator 144 may continue to refine the weights and biases of its neural networks to learn to classify the received input as valid.

The rasterized images 560 may be substantially the same as the rasterized images 360 shown and described with respect to FIG. 3. For example, the rasterized images 560 may be generated by the rasterization circuitry 134 based on the received valid layout clips 551. The discriminator 144 generates an output D(x) based on the received rasterized images 560. The output D(x) may represent, for example, a classification value for the received rasterized images 560.

Random noise vectors 570 are converted to noise images 580, which are provided as input to the generator 142, as shown. The random noise vectors 570 may be substantially the same as the noise vectors 450 described with respect to FIG. 4. Similarly, the noise images 580 may be substantially the same as the noise images 460 described with respect to FIG. 4.

The generator 142 outputs a generated image 582 based on a received noise image 580. This process may be the same as previously described with respect to generation of the images 462 by the generator 142 based on noise images 460 illustrated in FIG. 4. However, in the method illustrated in FIG. 5, the weights and biases of the generator 142 are fixed. Since the generator 142 may be pre-trained, for example, as described with respect to FIG. 4, the generated images 582 output by the generator 142 should be representative of valid layouts, or should be close to being representative of valid layouts. These generated images 582 may thus be used as training data for further training the discriminator 144.

The generated images 582 output by the generator 142 are provided to the discriminator 144, and the discriminator 144 generates an output D(G) based on the received generated images 582. The output D(G) may represent, for example, a classification value for the received generated images 582.

The discriminator 144 outputs loss information which may represent the loss (or closeness to being "valid") of outputs of the discriminator 144 based on the rasterized images 560 (e.g., D(x)) and the outputs of the discriminator 144 based on the generated images 582 (e.g., D(G)). The loss information is provided as feedback to the discriminator 144, which further trains the discriminator 144.

In some embodiments, the discriminator 144 may be trained to adjust its internal weights and biases in order to maximize the following objective function, where E represents an expectation value:

$$E[\log(D(x))]+E[\log(1-D(G))]$$

Referring now to FIG. 6, the generator 142 is further trained while the weights and biases of the neural networks of the discriminator 144 are fixed. The method of training of the generator 142 illustrated in FIG. 6 may be the same as the method of pre-training the generator 142 illustrated in FIG. 4. However, the generator 142 may already be pre-trained and it may be further as illustrated in FIG. 6. In particular, the training of the generator 142 illustrated in FIG. 6 includes providing rasterized noise images to the generator 142, which may be noise images that are rasterized by rasterization circuitry 134. The generator 142 outputs generated images, which are received by the discriminator 144 and classified. Loss information, which may indicate a closeness of the generated image to being classified as "valid," is provided as feedback information to the generator 142, which further trains the generator 142.

In some embodiments, the generator 142 may be trained to adjust its internal weights and biases in order to maximize the following objective function, where E represents an expectation value:

$$E[\log(D(G))]$$

The methods illustrated in FIGS. 5 and 6 may be alternately performed a plurality of times to co-optimize the discriminator 144 and the generator 142. That is, the discriminator 144 may be further trained while fixing the weights and biases of the generator 142, as shown in FIG. 5, and next the generator 142 may be trained while fixing the weights and biases of the discriminator 144. This sequence of training the discriminator 144, then the generator 142 may be iterated any number of times to refine the training of each of the discriminator 144 and the generator 142.

Figure 7:
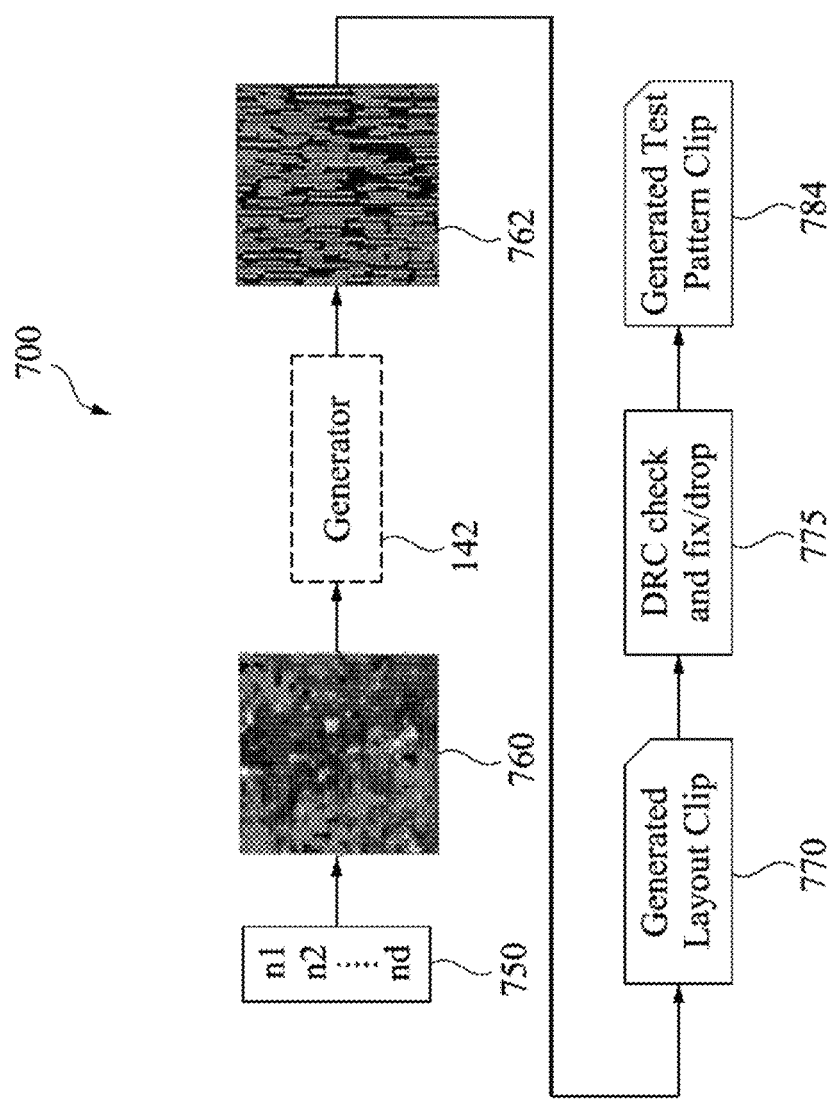
FIG. 7 is a flow chart illustrating a test pattern generation method, in accordance with some embodiments.

FIG. 7 is a flow chart 700 illustrating a test pattern generation method, in accordance with one or more embodiments. The test pattern generation method may be performed, for example, once the generator 142 has been sufficiently trained to generate images (e.g., pattern images) which are consistently representative of valid layouts.

As shown in FIG. 7, noise images 760 are generated based on received random noise vectors 750. The random noise vectors 750 may be provided, for example, as noise input 120 as shown and described with respect to FIG. 2. The noise images 760 may be generated, for example, by the rasterization circuitry 134 previously described herein. The noise images 760 may be processed by test pattern generation circuitry 132 or the test pattern machine learning circuitry 140. For example, the noise images 760 may be provided to the generator 142 of the test pattern machine learning circuitry 140. The generator 142 may be trained, for example, as described with respect to FIGS. 3 through 6. The generator 142 may thus generate a generated pattern image 762 based on the received noise image 760. Since the generator 142 has been trained to consistently generate pattern images that are representative of valid layout clips, the pattern image 762 should represent a valid layout clip which would be free of DRC violations. The generated pattern image 762 may be substantially the same as the generated image 462 described with respect to FIG. 4, except that the generated pattern image 762 is the output of the generator 142 after it has been sufficiently trained to output such pattern images that are representative of valid layout clips.

The generated pattern image 762 is converted into a corresponding layout clip 770, for example, as described previously herein with respect to FIG. 2. For example, the generated pattern image 762 may be converted to a layout clip 770 by the test pattern generation circuitry 132, which may access the layout shape database 112 and convert shapes in the generated pattern image 762 into geometrical shapes of a layout or of layout components stored in the layout shape database 112 and which may be formatted in a GDS format.

The generated layout clip 770 may then be analyzed by DRC check circuitry 136 and DRC violations in the generated layout clip may be fixed as shown at 775. If the generated layout clip 770 is determined to be free of DRC violations, for example, by the DRC check circuitry 136, then the layout clip 770 may be considered as a valid test pattern 784 (e.g., a generated test layout that is free of DRC violations), and the test pattern 784 may be stored in the test pattern database 114.

In some cases, the DRC check circuitry 136 may identify one or more DRC violations in the generated layout clip 770 at 775, and the DRC check circuitry 136 or the test pattern generation circuitry 132 may be configured to fix such identified DRC violations in the generated layout clip 770. For example, the DRC check circuitry 136 or the test pattern generation circuitry 132 may be configured to apply one or more design rules to adjust the arrangement of geometric shapes in the generated layout clip 770, such as by adjusting a spacing between the geometric shapes, or decreasing or increasing a width of one or more of the geometric shapes. The layout clip 770, once modified to fix the DRC violations, may be rechecked by the DRC check circuitry 136 to confirm that it is free of DRC violations, in which case, the modified layout clip may be stored as a valid test pattern 784 in the test pattern database 114.

In some embodiments, a generated layout clip 770 may be discarded by the test pattern generation system 100 in response to the DRC check circuitry 136 determining that the layout clip has one or more DRC violations.

Embodiments of the present disclosure provide several advantages. For example, in some embodiments, test patterns may be generated without any prior knowledge regarding design rules that are specified for a particular device type or semiconductor manufacturing process. Instead, utilizing machine learning approaches as described herein, the test patterns may be generated based on the trained machine learning models which may be trained based only on past data, such as past data in the form of layout clips for electronic device designs which have been previously determined to be free of DRC violations, as well as layout clips for electronic device designs which have been previously determined to include one or more DRC violations. The machine learning models may be updated or may learn to generate test patterns based on such training input.

Embodiments of the present disclosure further facilitate significant improvements in design implementation turn-around time, since test patterns can be generated without requiring a user to manually create the test patterns with reference, for example, to design rules that are specified for a particular device type or semiconductor manufacturing process.

Embodiments provided herein include systems and methods for generating test patterns which may be used for early assessments of lithographic or other semiconductor manufacturing processes, including, for example, for testing design rule check (DRC) features of an electronic device platform. In some embodiments, machine learning techniques are utilized to generate the test patterns, and the machine learning techniques may be used to generate the test patterns so that they conform to DRC rules which may be proscribed for particular semiconductor manufacturing processes or for particular electronic device types.

According to one embodiment, a test pattern generation system includes test pattern generation circuitry. The test pattern generation circuitry, in use, receives a noise image. The test pattern generation circuitry generates a pattern image based on the noise image. Additionally, the test pattern generation circuitry generates a test pattern based on the pattern image. The test pattern is representative of geometric shapes of an electronic device design layout that is free of design rule check (DRC) violations.

According to another embodiment, a method is provided that includes receiving, by test pattern generation circuitry, a noise image representative of random noise. The test pattern generation circuitry generates a pattern image based on the received noise image. The method further includes generating, by the test pattern generation circuitry, a test pattern based on the pattern image. The test pattern is representative of geometric shapes of an electronic device design layout that is free of design rule check (DRC) violations.

According to yet another embodiment, a method is provided that includes training a discriminator of a test generation machine learning circuitry. The discriminator is trained by providing first and second training inputs. The first training input is representative of a first plurality of layout clips to the discriminator, and the first plurality of layout clips are layout clips for electronic devices which are known to be free of design rule check (DRC) violations. The second training input is representative of a second plurality of layout clips to the discriminator, and the second plurality of layout clips are layout clips for electronic devices which are known to include one or more DRC violations. The method further includes modifying parameters of the discriminator based on the training, and the discriminator is configured to classify a received input as being representative of a valid layout clip or an invalid layout clip based on the modified parameters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A test pattern generation system, comprising:
test pattern generation circuitry, which, when in use:
receives a noise image;
generates a pattern image based on the noise image; and
generates a test pattern based on the pattern image, the test pattern being representative of geometric shapes of an electronic device design layout that is free of design rule check (DRC) violations; and
rasterization circuitry, which, when in use:
receives a noise vector; and
generates the noise image as a raster image of the noise vector.

2. The system of claim 1 wherein the test pattern generation circuitry includes:
test generation machine learning circuitry having a generator and a discriminator, each of the generator and the discriminator including a respective trained convolutional neural network, the generator being configured to generate the pattern image based on the noise image, the discriminator being configured to classify the pattern image as representative of a valid layout clip or an invalid layout clip.

3. The system of claim 1, further comprising:
a layout shape database which stores information representative of geometrical shapes of a plurality of features of electronic device layouts,
wherein the test generation circuitry is configured to generate the test pattern by converting one or more shapes in the pattern image into one or more of the geometrical shapes stored in the layout shape database.

4. The system of claim 1, further comprising:
DRC check circuitry configured to analyze the test pattern and determine whether one or more DRC violations are present in the test pattern.

5. The system of claim 4, further comprising:
a test pattern database,
wherein the test pattern generation circuitry is configured to provide the test pattern to the test pattern database for storage in response to the DRC check circuitry determining that the test pattern is free of DRC violations.

6. A method, comprising:
receiving, by test pattern generation circuitry, a noise image representative of random noise;
generating, by the test pattern generation circuitry, a pattern image based on the received noise image;
generating, by the test pattern generation circuitry, a test pattern based on the pattern image, the test pattern being representative of geometric shapes of an electronic device design layout that is free of design rule check (DRC) violations;
receiving, by rasterization circuitry, a random noise vector; and
generating, by the rasterization circuitry, the noise image as a raster image of the random noise vector.

7. The method of claim 6, wherein the generating the test pattern includes generating the test pattern by converting one or more shapes in the generated pattern image into one or more geometrical shapes stored in a layout shape database.

8. The method of claim 6, further comprising:
determining, by DRC check circuitry, whether one or more DRC violations are present in the test pattern.

9. The method of claim 8, further comprising:
storing the test pattern in a test pattern database in response to determining that the test pattern is free of DRC violations.

10. The method of claim 8, further comprising:
adjusting, by the test pattern generation circuitry, at least one of a spacing between one or more of the geometric shapes represented by the test pattern or a width of one or more of the geometric shapes represented by the test pattern.

11. The method of claim 6, further comprising:
classifying, by a discriminator, the pattern image as representative of a valid layout clip or an invalid layout clip.

12. The method of claim 6, wherein the test pattern generation circuitry includes:
test generation machine learning circuitry having a generator and a discriminator, each of the generator and the discriminator including a respective trained convolutional neural network.

13. A test pattern generation system, comprising:
test pattern generation circuitry, which, when in use:
receives a noise image;
generates a pattern image based on the noise image; and
generates a test pattern based on the pattern image, the test pattern being representative of geometric shapes of an electronic device design layout that is free of design rule check (DRC) violations; and
test generation machine learning circuitry including a generator and a discriminator, the generator being configured to generate the pattern image based on the noise image, the discriminator being configured to classify the pattern image as representative of a valid layout clip or an invalid layout clip.

14. The system of claim 13, wherein the discriminator is configured to:
receive first training input representative of a first plurality of layout clips, the first plurality of layout clips being layout clips for electronic devices which are known to be free of design rule check (DRC) violations;
receive second training input representative of a second plurality of layout clips, the second plurality of layout clips being layout clips for electronic devices which are known to include one or more DRC violations; and
modify parameters of the discriminator based on the received first training input and second training input, the discriminator being configured to classify a received input as being representative of a valid layout clip or an invalid layout clip based on the modified parameters.

15. The system of claim 14, wherein the discriminator is configured to modify at least one of a weight or a bias of a convolutional neural network based on the received first training input and second training input.

16. The system of claim 14, further comprising:
rasterization circuitry, which, when in use:
receives a noise vector; and
generates the noise image as a raster image of the noise vector.

17. The system of claim 16, wherein the rasterization circuitry is configured to:
receive the first plurality of layout clips;
generate the first training input as a first plurality of raster images based on the first plurality of layout clips;
receive the second plurality of layout clips; and
generate the second training input as a second plurality of raster images based on the second plurality of layout clips.

18. The system of claim 13, further comprising:
a layout shape database which stores information representative of geometrical shapes of a plurality of features of electronic device layouts,
wherein the test generation circuitry is configured to generate the test pattern by converting one or more shapes in the pattern image into one or more of the geometrical shapes stored in the layout shape database.

19. The system of claim 13, further comprising:
DRC check circuitry configured to analyze the test pattern and determine whether one or more DRC violations are present in the test pattern.

20. The system of claim 19, further comprising:
a test pattern database,
wherein the test pattern generation circuitry is configured to provide the test pattern to the test pattern database for storage in response to the DRC check circuitry determining that the test pattern is free of DRC violations.

* * * * *